US012597761B2

(12) United States Patent　(10) Patent No.: US 12,597,761 B2
Kang et al.　(45) Date of Patent: Apr. 7, 2026

(54) SYSTEMS AND METHODS FOR SERIES-CONNECTED VCSEL ARRAY

(71) Applicant: Shenzhen Raysees AI Technology Co. Ltd., Shenzhen (CN)

(72) Inventors: Dongseok Kang, Mt Pleasant, MI (US); Yongxiang He, Sunnyvale, CA (US); Siva Kumar Lanka, Reno, NV (US); Yang Wang, Hefei (CN)

( * ) Notice: Subject to any disclaimer, the term of this patent is extended or adjusted under 35 U.S.C. 154(b) by 1032 days.

(21) Appl. No.: 17/766,900

(22) PCT Filed: Oct. 9, 2019

(86) PCT No.: PCT/CN2019/110159
§ 371 (c)(1),
(2) Date: Apr. 6, 2022

(87) PCT Pub. No.: WO2021/068132
PCT Pub. Date: Apr. 15, 2021

(65) Prior Publication Data
US 2023/0128994 A1　Apr. 27, 2023

(51) Int. Cl.
*H01S 5/42* (2006.01)
*H01S 5/40* (2006.01)
(52) U.S. Cl.
CPC ............ *H01S 5/423* (2013.01); *H01S 5/4018* (2013.01)
(58) Field of Classification Search
CPC ...... H01S 5/423; H01S 5/4018; H01S 5/0208; H01S 5/02345; H01S 5/18311; H01S 5/04256; H01S 5/04257
See application file for complete search history.

(56) References Cited

U.S. PATENT DOCUMENTS 9,705,283 B1　7/2017　Deppe et al.
10,199,794 B1　2/2019　Yuen
(Continued)

FOREIGN PATENT DOCUMENTS

CN　　101188345　　5/2008
CN　　201877674　　6/2011
CN　　104779520　　7/2015

OTHER PUBLICATIONS

Translated office action from The State Intellectual Property Office of People's Republic of China regarding Chinese application No. 201980101161.0 (foreign counterpart of the current application) from Global Dossier.

*Primary Examiner* — Yuanda Zhang
(74) *Attorney, Agent, or Firm* — Jigang Jin

(57) ABSTRACT

A VCSEL array comprises series-connected VCSEL sub-arrays formed on a single chip. The VCSEL sub-arrays each comprises VCSEL emitters fabricated on a semi-insulating layer. A common cathode contact of a VCSEL sub-array is electrically connected to a common anode contact of a neighboring VCSEL sub-array. To reduce leakage, the band-gap energy level of the semi-insulating layer is higher than the photon energy of the output beam. In one embodiment, the semi-insulating layer is grown on a conductive layer. A common cathode contact of the last VCSEL sub-array in a series is electrically connected to the conductive layer. In another embodiment, multiple wire-bonding areas are electrically connected to common anode contacts of multiple VCSEL sub-arrays respectively. The wire-bonding areas provide different input impedance options for a VCSEL array.

20 Claims, 5 Drawing Sheets

(56) References Cited

U.S. PATENT DOCUMENTS

| 2013/0163627 | A1 | | 6/2013 | Seurin et al. |
| 2019/0036308 | A1 | | 1/2019 | Carson et al. |
| 2020/0313401 | A1 | * | 10/2020 | Yuen ................... H01S 5/02345 |

* cited by examiner

VCSEL Array 100

VCSEL Array 200

VCSEL Array 600

SYSTEMS AND METHODS FOR SERIES-CONNECTED VCSEL ARRAY

CROSS-REFERENCE TO RELATED APPLICATIONS

This application is the U.S. National Stage of International Application No. PCT/CN2019/110159, filed Oct. 9, 2019, the content of which is incorporated herein by reference in its entirety.

TECHNICAL FIELD

This invention generally relates to Vertical Cavity Surface Emitting Laser (VCSEL) arrays and specifically to series-connected VCSEL arrays.

BACKGROUND ART

VCSELs have clear advantages over edge-emitting semiconductor lasers in several aspects. A VCSEL emits a circular beam perpendicular to a chip surface. The beam has a narrow spectrum. It has superior reliability and lower sensitivity to temperature. It may be made economically by wafer-level manufacture. It offers design flexibility in addressable large VCSEL arrays which may contain thousands or tens of thousands of individual emitters.

In recent years, VCSEL arrays become a prominent player in three-dimensional (3D) sensing applications. For instance, many smartphones are equipped with a VCSEL-array-based 3D sensor for facial recognition. In addition, VCSEL-array-based detectors have entered the emerging autonomous vehicle landscape and may help recognize running vehicles and walking or standing pedestrians on a road effectively and quickly, which may prevent fatal accidents and thus mitigate one of the most challenging issues a driverless car faces.

Light detection and ranging (LIDAR) systems, radars, and cameras are the main sensing means for mapping surroundings of a driverless car. They may be used individually or in a combined manner. Among them, only LIDAR provides satisfactory spatial resolution, especially for objects at a distance. LIDAR is based on time of the flight (ToF) measurement principles. It illuminates a scene with a laser beam. The beam is scattered by objects of the scene. It then detects the bounce-back of the beam. The distance is calculated by the time it takes for the beam to travel to the objects and back from them. Automotive LIDAR may be built using a VCSEL array and a scanning device. The scanning device may enable a wide, such as 360 degrees, field of view. Another option is flash LIDAR. Flash LIDAR has no moving parts. It doesn't scan a beam over the scene. Instead, it captures an image in a single flash using a pulsed laser source and a two-dimensional (2D) photodetector array. Each detector captures the distance, position, and reflected intensity of a spot.

VCSEL arrays may be used to make flash LIDAR systems, as flash LIDAR requires a high power, low-brightness, and short-pulse laser source. The pulse width may be between 1-25 nanoseconds. There are short-pulse high-current semiconductor laser drivers. For optimized coupling between a VCSEL array and a laser driver circuit, the electrical input impedance of the VCSEL array should match the output impedance of the pulsed driver circuit. Because in a conventional VCSEL array, the emitters are parallelly connected with a common cathode contact and shorted anode contacts, the overall electrical impedance is very low and an additional resistor that consumes energy is required. Moreover, after a VCSEL array chip is made, the impedance characteristic is finalized and cannot be changed. The fixed impedance limits applications of the VCSEL chips and increases the production cost.

Therefore, there exists a need for an improved VCSEL array which provides input impedance matching the output impedance of a pulsed laser driver circuit. There also exists a need for an improved VCSEL array which provides multiple input impedance options after the VCSEL array is fabricated on a chip.

SUMMARY OF INVENTION

Technical Problem

Solution to Problem

Technical Solution

The present invention discloses methods, apparatus, and systems for a series-connected VCSEL array on a single chip. The proposed array comprises VCSEL sub-arrays fabricated on a semi-insulating layer. The sub-arrays each comprise a group of VCSEL emitters which have a common cathode contact and a common anode contact. The sub-arrays are electrically connected in series. A common cathode contact of a sub-array is connected to a common anode contact of a neighboring sub-array by a connection structure. The connection structure is made by a metal deposition process.

In one embodiment, materials of the semi-insulating layer are selected such that its bandgap energy level is higher than the photon energy of the output beam. Thus, the semi-insulating layer is transparent to the output wavelengths of the VCSEL array. Photon-induced carrier generation and resultant leaky currents between sub-arrays are reduced.

In another embodiment, two wire-boding areas are configured on the top surface of the VCSEL chip. One wire-bonding area is connected with the common anode contact of the first sub-array in a series. The other wire-bonding area is connected with the common cathode contact of the last sub-array in the series.

In another embodiment, the semi-insulating layer is epitaxially grown on a conductive layer. A metal layer is deposited on the bottom surface of the conductive layer. The common anode contact of the first sub-array is connected to a wire-bonding area on the top surface of the VCSEL chip. The common cathode contact of the last VCSEL sub-array is connected to the conductive layer and the metal layer through a metal structure and a via hole.

In another embodiment, multiple wire-bonding areas are configured for anodes of multiple VCSEL sub-arrays. One of the sub-arrays may be selected as the first sub-array in a series, when a specific total input impedance of a VCSEL array package is needed. As the selection may be made in a packaging process, the embodiment enables a VCSEL chip to provide multiple input impedance options.

Advantageous Effects of Invention

BRIEF DESCRIPTION OF DRAWINGS

Description of Drawings

Figure 1:
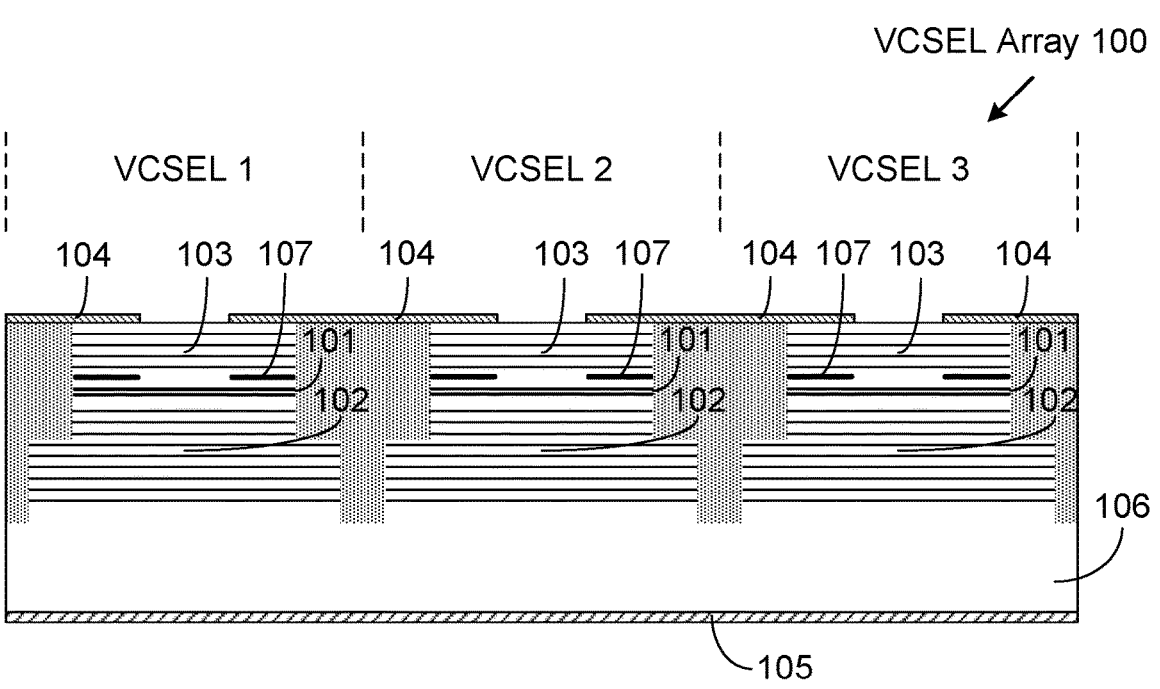

The subject matter, which is regarded as the invention, is particularly pointed out and distinctly claimed in the claims at the conclusion of the specification. The foregoing and other features and also the advantages of the invention will be apparent from the following detailed description taken in conjunction with the accompanying drawings. Additionally, the leftmost digit of a reference number identifies the drawing in which the reference number first appears.

FIG. 1 is a cross-sectional view of a prior art VCSEL array.

Figure 2:
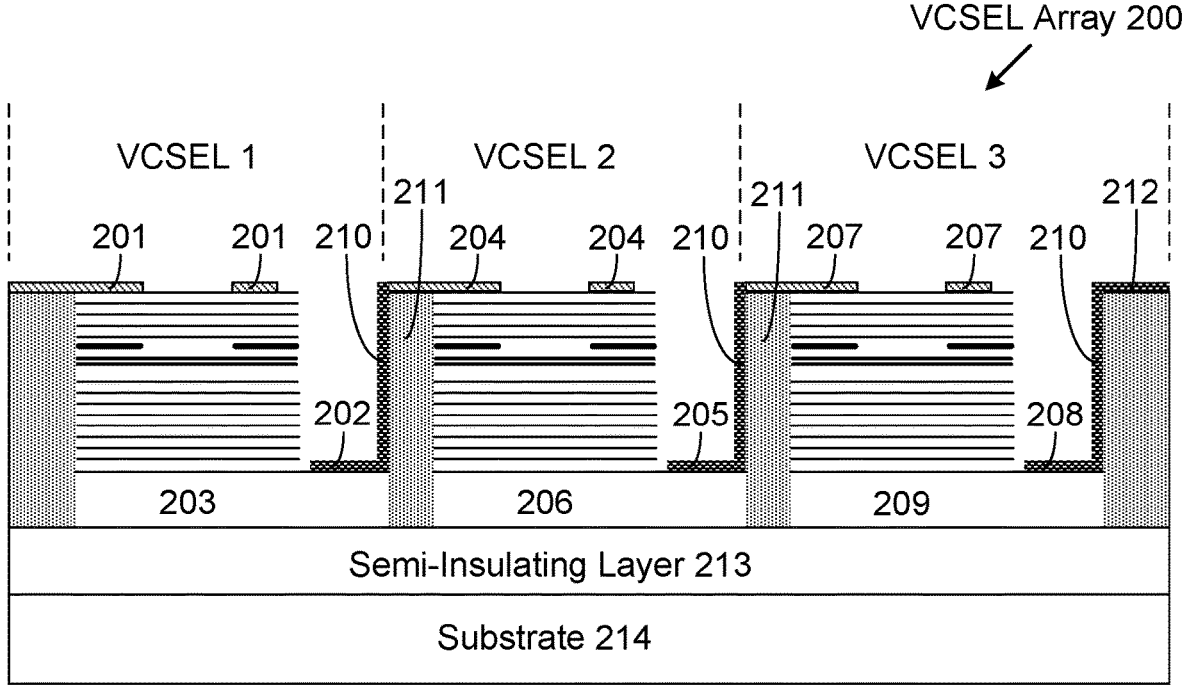

FIG. 2 schematically illustrates a cross-sectional view of a VCSEL array containing series-connected VCSEL emitters, according to one embodiment of the present invention.

Figure 3:
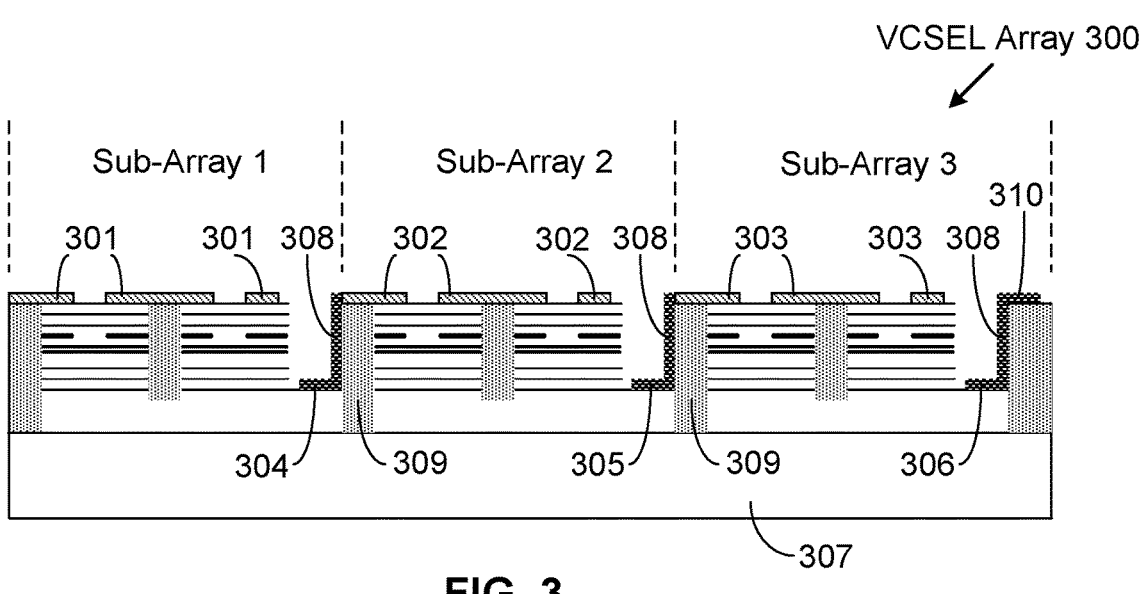

FIG. 3 schematically illustrates a cross-sectional view of a VCSEL array containing series-connected sub-arrays, according to one embodiment of the present invention.

Figure 4:
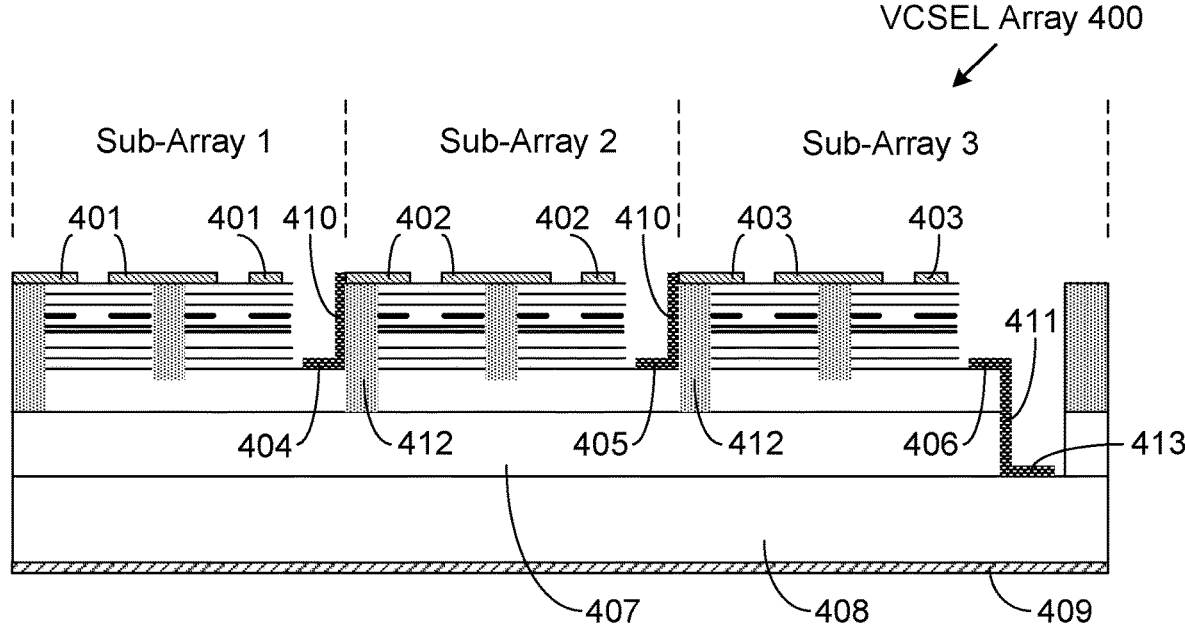

FIG. 4 schematically illustrates a cross-sectional view of a VCSEL array containing series-connected sub-arrays on a conductive substrate, according to one embodiment of the present invention.

Figure 5:
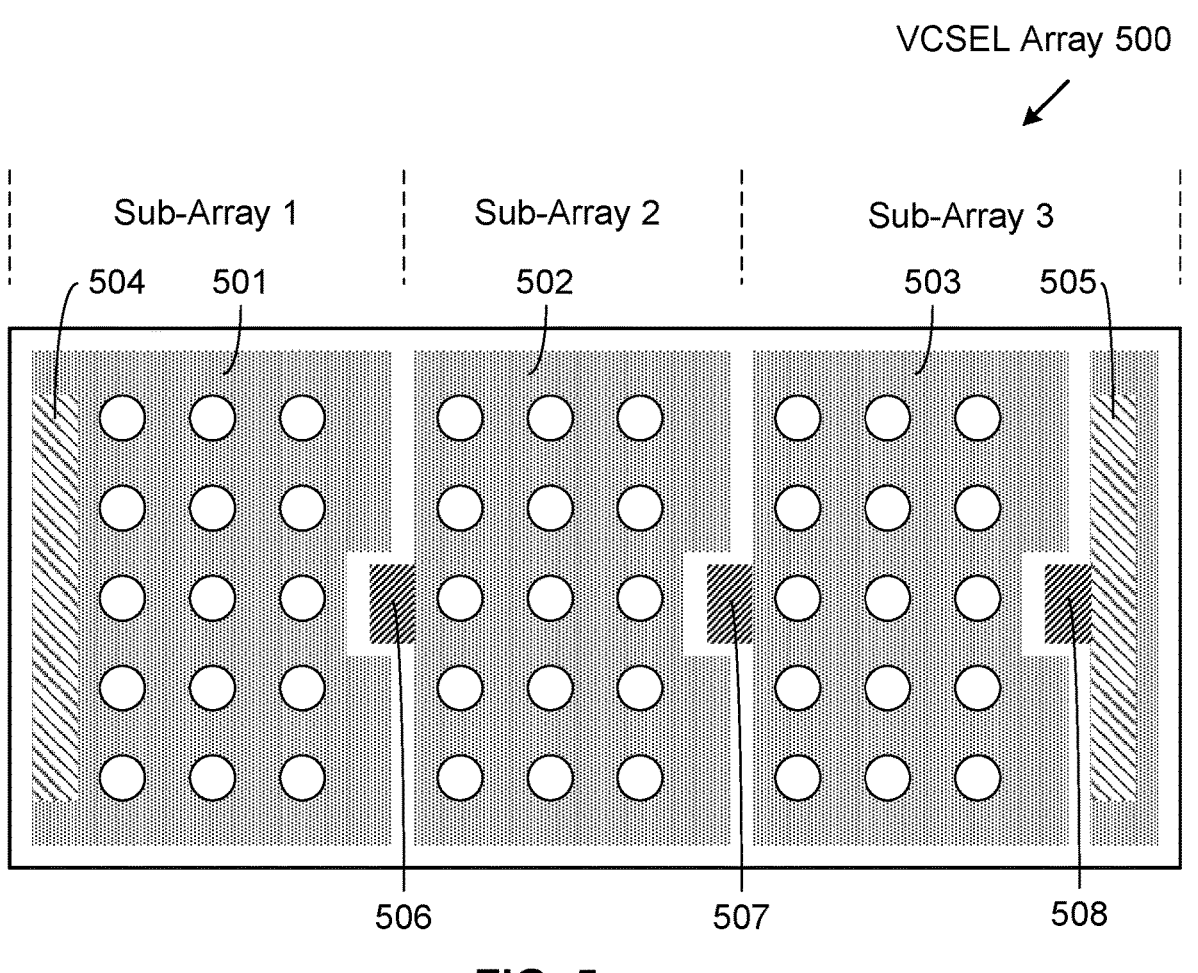

FIG. 5 illustrates a schematic top view of a VCSEL array containing series-connected sub-arrays, according to one embodiment of the present invention.

Figure 6:
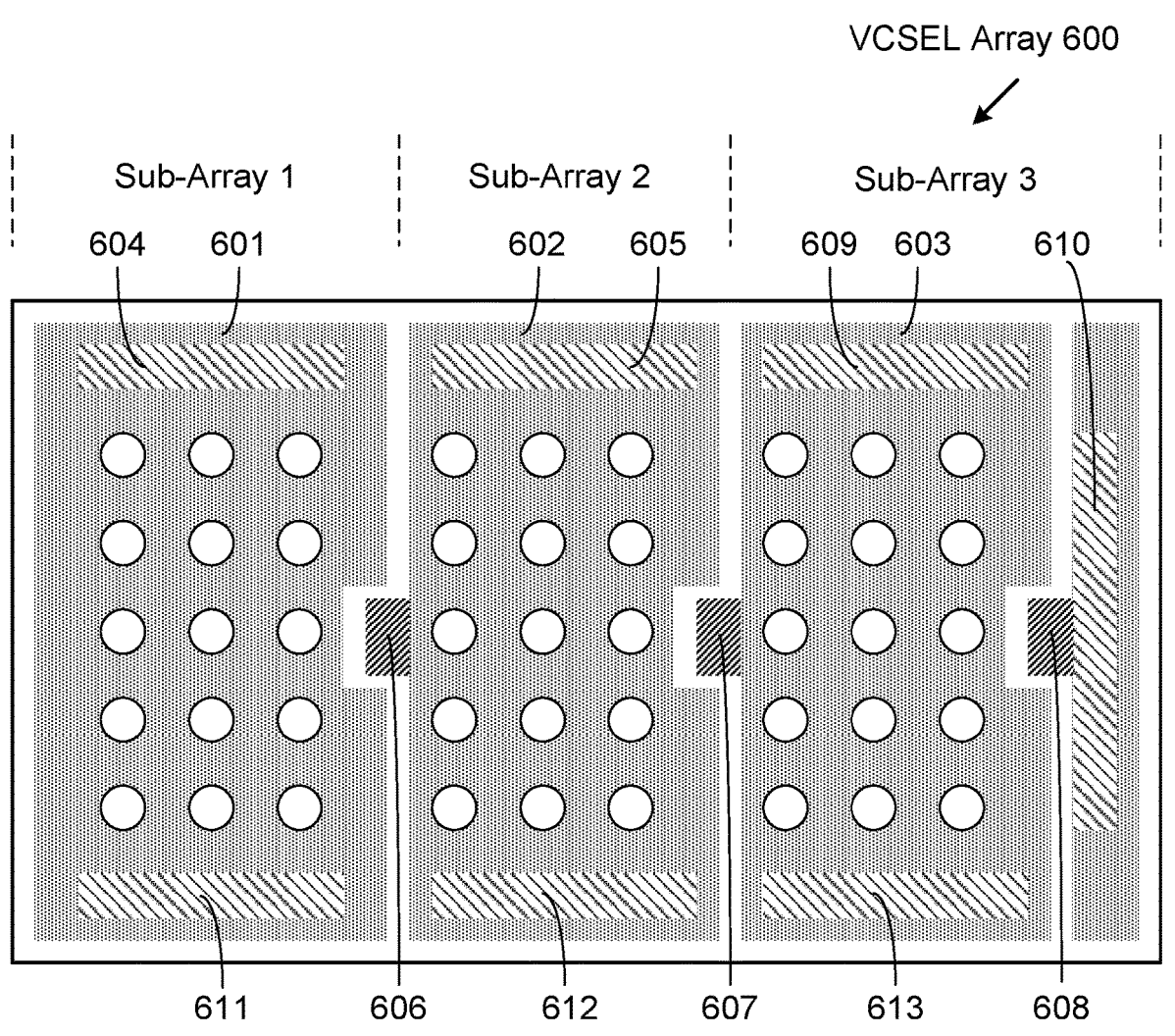

FIG. 6 illustrates a schematic top view of a VCSEL array containing multiple wire-bonding areas, according to one embodiment of the present invention.

Figure 7:
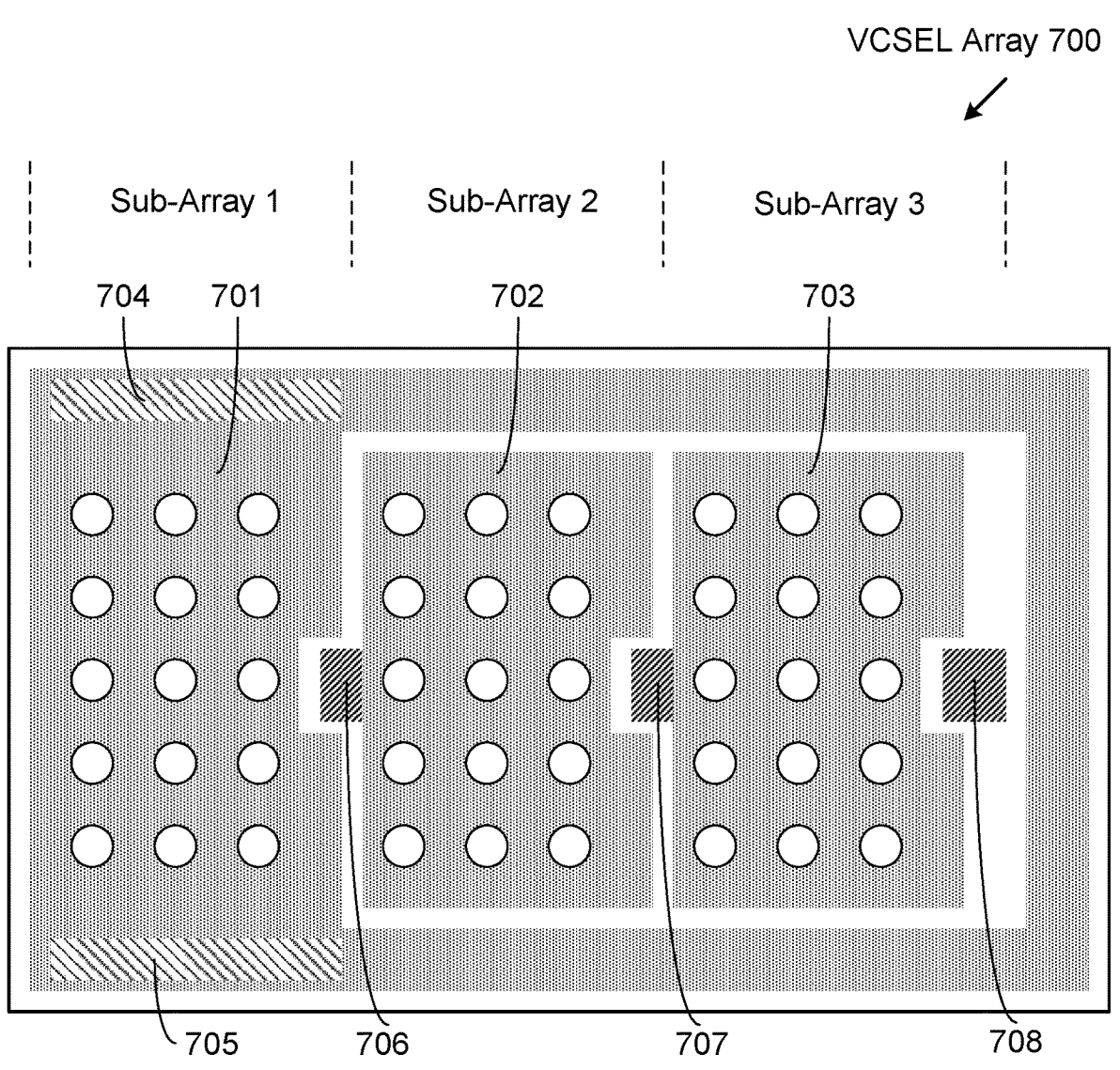

FIG. 7 illustrates a schematic top view of a VCSEL array where a cathode terminal is connected to a bottom contact metal, according to one embodiment of the present invention.

MODE FOR THE INVENTION

Mode for Invention

Detailed description of the present invention is provided below along with figures and embodiments, which further clarifies the objectives, technical solutions, and advantages of the present invention. It is noted that schematic embodiments discussed herein are merely for illustrating the invention. The present invention is not limited to the embodiments disclosed.

FIG. 1 shows a prior art VCSEL array 100 in a cross-sectional view. Array 100 comprises VCSELs 1, 2, and 3 on a substrate 106. The VCSELs are separated by isolation trenches. Substrate 106 is a conductive n-type substrate. It is noted that array 100 may comprise thousands or tens of thousands of VCSELs. Thus, the three VCSELs are shown here for explanation purposes. Similarly, in other figures and descriptions below, only a few VCSELs or VCSEL sub-arrays are used for explaining principles. VCSEL 1, 2, or 3 represents a top-emitting VCSEL structure or VCSEL emitter which emits a laser beam through the top surface when charged with an electrical current. As used herein, a VCSEL, VCSEL structure, and VCSEL emitter have the same meaning and may be used interchangeably.

As shown in the figure, each VCSEL includes an active region 101 and reflector regions 102 and 103. For a typical VCSEL, active region 101 contains a multiple-quantum-well (MQW) configuration, reflector region 102 contains an n-type Distributed Bragg Reflector (DBR), and reflector region 103 contains a p-type DBR. The quantum well and DBRs are grown on substrate 106 in an epitaxial process. Reflector regions 102 and 103 are electrically conductive. A selectively oxidized structure 107 is formed close to active region 101 to achieve current and/or optical confinement. Current and/or optical confinement may also be achieved through ion-implantation. A dielectric layer (not shown) may be deposited on the top surfaces of reflector regions 103 and a plurality of vias (not shown) may be etched on the dielectric layer. Then, a metal layer 104 may be deposited on the etched areas and the dielectric layer. In the figure, metal layer 104 is presented in a simplified manner, mainly displaying the metal contact function. On the bottom surface of substrate 106, a metal layer 105 is deposited. Metal layers 104 and 105 serve as the anode and cathode contacts, respectively.

Array 100 is a regular VCSEL array. VCSELs 1, 2, and 3 share a common cathode contact 105. Since metal layers 104 are electrically connected (not shown), the anode contacts of the VCSELs are shorted. Metal layer 104 is deposited to electrically connect all VCSELs. Thus, the VCSELs are connected in parallel, i.e., a conventional design. When the array is in operation, each unit is electrically charged in parallel. Consequently, the total input impedance of the array may be much lower than the output impedance of a pulsed laser driver circuit. Impedance mismatch affects coupling between the VCSEL array and the laser driver circuit.

FIG. 2 schematically illustrates a VCSEL array 200 in a cross-sectional view, according to one embodiment of the present invention. Array 200 comprises VCSELs 1, 2, and 3. The VCSELs are fabricated on an electrically semi-insulating layer 213 on top of a growth substrate 214. The semi-insulating layer 213 may comprise undoped semiconductor material that provides high resistivity. Like the configuration shown in FIG. 1, each VCSEL structure may include an active region, an n-type DBR as a reflector region, a p-type DBR as the other reflector region, and a current and/or optical confining structure. But unlike a conventional VCSEL array such as the one in FIG. 1, VCSELs 1, 2, and 3 are electrically connected in series. Thus, anode contacts of the VCSELs are not shorted. Cathode contacts of the VCSELs do not share a common conductive layer.

As shown in FIG. 2, n-type conductive layers 203, 206, and 209 are epitaxially grown on layer 213. Then the VCSEL structures are grown on the conductive layers. The conductive layers and the VCSEL structures are separated by an isolation structure 211, such as an isolation trench, which may be made by chemical etching or ion implantation. Part of the VCSEL structures may be etched to expose the conduction layers of each VCSEL. P-metal layers 201, 204, and 207 are deposited on the top surfaces as separate anode contacts. N-metal layers 202, 205, and 208 are deposited on the exposed conduction layers as cathode contacts for the emitters. Isolation structure 211 electrically isolates each VCSEL in lateral directions.

In order to connect the VCSELs in series, a metal structure 210 may be deposited in the array area by a metal deposition process. Metal structure 210 may be made when p-metal layers 201, 204, 207 and/or n-metal layers 202, 205, 208 are deposited during the wafer-level fabrication of the VCSEL array 200. The structure may also be made separately. It electrically connects a cathode contact of a VCSEL with an anode contact of a neighboring or adjacent VCSEL. As shown in the figure, metal layers 202 and 204 are connected and so are metal layers 205 and 207. Thus, it is metal structure 210 that series connects the VCSELs. Such a metal structure is repeatedly used for series connection in embodiments which will be discussed below. Metal structure 210 may also include a via structure which shorts a cathode contact of a VCSEL with an anode contact of a neighboring VCSEL. For VCSEL 3, the last one in the VCSEL series, metal structure 210 connects metal layer 208 to a cathode metal 212 on the top surface of the VCSEL array. Cathode metal 212 is the cathode terminal of the series-connected VCSEL array.

Comparing a parallel-connected VCSEL array with a series-connected VCSEL array, such as the two arrays in FIGS. 1 and 2, the overall input impedance of the series-connected array is better matched to the output impedance of a laser driver. Moreover, the slope efficiency, which reflects the relationship between the laser output power and the input electric current or input electric power, may be increased significantly.

Since there exists an electric potential difference between neighboring conductive layers, such as between layers 203 and 206, photon-induced carrier generation may cause undesired current leakage in semi-insulating layer 213. For instance, if layer 213 absorbs leaky beams produced by the VCSELs, resulting electron-hole pairs may cause leaky currents between neighboring conductive layers. To reduce the photon-induced carrier generation, layer 213 may have a bandgap energy level which is higher than the photon energy of the VCSELs' output beam. When the bandgap is wide enough, layer 213 doesn't absorb photons emitted from the VCSELs and thus becomes transparent to the laser beams.

For instance, a GaAs layer is transparent to beams with wavelength larger than 870 nanometers. If the output wavelength is shorter than 870 nanometers, e.g., 850 nanometers, a select $Al_xGa_{1-x}As_{(x>0.1)}$ or $Ga_xIn_{1-x}P_{(x-0.5)}$ layer may be used, since those materials are transparent for beams of 850 nanometers. In addition, the composition of the semi-insulating layer may be chosen to optimize the thermal conductivity. For instance, Al content below 10% or higher than 90% is favorable for an AlGaAs layer in consideration of the thermal conductivity.

When layer 213 is transparent to the output beams, the VCSEL emitters as shown in FIG. 2 may also be designed to output a beam through the layer and become a backside-emitting VCSEL array, in addition to the top-emitting configurations discussed above. As both anode and cathode metal contacts can be arranged on the top layer of the array, they may be directly connected to metal contact regions on a submount in a flip-chip bonding process. In other embodiments, p-type conductive layer and p-type DBR may grow on the semi-insulating layer first and the n-type DBR is on the top of the array, and the locations of the anode and cathode contacts should change accordingly. For simplicity, p-metal layers and n-metal layers are all called metal layers in this application.

FIG. 3 schematically illustrates a VCSEL array 300 in a cross-sectional view, according to one embodiment of the present invention. Array 300 comprises exemplary VCSEL sub-arrays 1, 2, and 3. Array 300 may also contain more than three sub-arrays or many sub-arrays. In general, a VCSEL array may be equally divided into a group of sub-arrays. If an array contains a large number of emitters, there may be multiple options to divide it to form different sub-array patterns. Thus, the number of sub-arrays may be varied depending on how an array is divided.

In FIG. 3, each sub-array contains two parallel-connected VCSEL emitters schematically. As said, the sub-array may comprise many parallel-connected VCSEL emitters in practice, such as tens or hundreds of them. The sub-arrays are fabricated on a semi-insulating layer 307 on top of a growth substrate (not shown). Each sub-array has a conductive layer which is grown on layer 307 epitaxially. The conductive layers are shared by VCSEL structures of a sub-array built on it. Like the embodiment shown in FIG. 2, a VCSEL structure may include an active region, an n-type DBR as a reflector region, a p-type-DBR as the other reflector region, and a current and/or optical confining structure. In a sub-array, the VCSELs share a common anode contact and a common cathode contact.

In the figure, metal layers 301, 302, and 303 are deposited on the top contact layer of the VCSELs and represent the common anode contacts of the sub-arrays respectively. Through an etching process, holes are made to expose parts of the conductive layers. Metal layers 304, 305, and 306 are deposited on the exposed areas. Metal layers 304, 305, and 306 represent the common cathode contacts of the sub-arrays. A metal structure 308, as a connection tool, shorts metal layers 304 and 302, 305 and 303 so that the sub-arrays become connected in series. The metal structure may be made by depositing a metal material on the sub-arrays in a separate process. Via holes or the walls of via holes, for instance, may be used to make the metal structure. The metal structure may also be deposited in a process when metal layers 301 and/or 304 is made. For sub-array 3, the last one in the sub-array series, metal structure 308 connects metal layer 306 to a cathode metal 310 on the top surface of the VCSEL array. Cathode metal 310 is the cathode terminal of the series-connected VCSEL array.

The VCSEL sub-arrays comprise emitters connected in parallel. The sub-arrays and conventional VCSEL arrays may have similar configurations. The sub-arrays are electrically separated from one another by an isolation structure 309 which extends vertically to layer 307. Isolation structure 309 may be an isolation trench made by ion implantation, oxidation, or chemical etching.

Again, to avoid undesired photon-induced carrier generation by the leaky beams, layer 307 may have a bandgap energy level which is higher than the photon energy of the VCSELs' output beam. Material of layer 307 may be chosen such that it has a matching lattice to the conductive layers and is transparent to the wavelength range of the output beam.

When layer 307 is transparent to the output beam, array 300 as shown in FIG. 3 may also be designed to be backside emitting, i.e., generating a beam through layer 307, in addition to the top-emitting configuration discussed. As both anode and cathode pad metals can be arranged on the top layer of the array, they may be directly connected to metal contact regions on a submount by a flip-chip bonding process.

Layer 307 may be an undoped substrate at the beginning of a fabrication process, e.g., an undoped GaAs wafer. The layer should be at least electrically semi-insulating. Alternatively, a semi-insulating layer may be grown on a conductive layer or conductive substrate, which is depicted in FIG. 4. FIG. 4 illustrates an exemplary VCSEL array 400 in a cross-sectional view. The array is built on a conductive substrate or conductive layer 408. A semi-insulating layer 407 is grown on layer 408 epitaxially. Layer 408 may have n-type or p-type doping, while layer 407 may be undoped. Array 400, fabricated on layer 407, comprises sub-array 1, 2, and 3 schematically. Like the embodiments aforementioned, the sub-arrays may include a common conductive layer and a group of VCSEL structures which have a common anode and common cathode contact. Each VCSEL structure may include an active region, a bottom DBR reflector region, a top DBR reflector region, and a current and/or optical confining structure. Metal layers 401, 402, and 403 represent common anode contacts of the sub-arrays, while metal layers 404, 405, and 406 represent the common cathode contacts of the sub-arrays. The sub-arrays are laterally isolated from one another by an isolation structure

7

412. Metal layers 404 and 405 are respectively connected to metal layers 402 and 403 through a metal structure 410 to make the sub-arrays connected in series.

As layer 408 is conductive, a via hole may be made to expose it and then a metal layer 413 may be deposited as the contact of layer 408. Then metal layer 406 may be electrically connected to metal layer 413 through the via hole and a metal configuration 411. Metal configuration 411 may be part of metal structure 410 which connects layer 404 with 402 and layer 405 with 403. Metal configuration 411 may also be made by a separate metal deposition process. Furthermore, a metal layer 409 may be deposited on the bottom surface of layer 408. Metal layer 409 may act as a cathode metal pad or bottom contact metal for the VCSEL array. The array may be attached to a submount via, for instance, solder bumps or solder paste. The attachment may electrically connect the bottom contact metal to the submount without using bonding wires.

Once again, to avoid undesired photon-induced carrier generation, layer 407 may have a bandgap energy level which is higher than the photon energy of the VCSELs' output beam. The photon-induced carrier generation produces leaky currents between adjacent sub-arrays and between sub-arrays 1 and 2 and conductive layer 408. Material of layer 407 may be chosen such that it has a matching lattice to layer 408 beneath it and the conductive layers above it and is transparent to the wavelength range of an output beam.

FIG. 5 illustrates a series-connected VCSEL array 500 in a top view schematically, according to one embodiment of the present invention. The exemplary array includes three sub-arrays 1, 2, and 3. VCSELs of the sub-arrays are represented by small circular areas in top metal layers. The circular areas are output windows of the VCSEL emitters. Metal layers 501 and 506 are the common anode and cathode contacts of sub-array 1. Metal layers 502 and 507 are the common anode and cathode contacts of sub-array 2. Metal layers 503 and 508 are the common anode and cathode contacts of sub-array 3. Metal layers 506 and 502 are connected by a metal structure and so are metal layers 507 and 503. The metal structure may resemble structure 308 of VCSEL array 300 (shown in FIG. 3). As a common cathode contact of a sub-array is electrically connected to a common anode contact of a neighboring sub-array, the sub-arrays are connected in series. Metal pads 504 and 505 are connected to the common anode contact of sub-array 1 and the common cathode contact of sub-array 3 respectively. After array 500 is mounted on a submount (not shown), bonding wires may be used to connect the array to contact regions on the submount.

VCSEL array 500 may be fabricated on a semi-insulating substrate or conductive substrate. If the array has a conductive substrate, a semi-insulating layer may be grown on it, like the embodiment shown in FIG. 4. Metal layers 501-503, 506-508, and a metal structure, which series connects the sub-arrays, may be deposited separately or made in one process. Metal deposition may be performed by the electron-beam (E-beam) or electro-plating method.

FIG. 6 schematically illustrates a series-connected VCSEL array 600 in a top view, according to one embodiment of the present invention. The exemplary array includes three sub-arrays which are electrically connected in series. The array may be built based on a semi-insulating substrate or conductive substrate. If the substrate is conductive, a semi-insulating layer may be grown on it, like the embodiment shown in FIG. 4. The circular areas represent output windows of the VCSELs.

Metal layers 601 and 606 are the common anode and cathode contacts of sub-array 1. Metal layers 602 and 607 are the common anode and cathode contacts of sub-array 2. Metal layers 603 and 608 are the common anode and cathode contacts of sub-array 3. Metal layers 606 and 602 are connected by a metal structure and so are metal layers 607 and 603. The metal structure may resemble structure 308 of VCSEL array 300 (shown in FIG. 3).

The metal structure connects the sub-arrays of array 600 in series. Unlike VCSEL array 500, where the anode pad metal of the VCSEL array is connected to the common anode contact of the first sub-array of the series, array 600 provides more options. For instance, three anode pad metals are provided, the first one is connected to the common anode contact of the first sub-array, the second anode pad metal is connected to the common anode contact of the second sub-array, and the third anode pad metal is connected to the common anode contact of the third sub-array. Thus, three configurations are available for selection.

When only one anode terminal of a VCSEL array is provided to connect to the common anode contact of the first sub-array, the total input impedance of a package containing the array and bonding wires is fixed and can't be adjusted. Since laser driver sources in various applications may have different output impedance characteristics, requirements for input impedance of VCSEL arrays may be different. Thus, there exists a need for a VCSEL array chip that provides more than one option of input impedance through a packaging process.

In FIG. 6, wire-bonding areas 604 and 611, 605 and 612, and 609 and 613 are fabricated as anode metal pads for sub-arrays 1, 2, and 3 respectively. A wire-boding area 610 is the cathode metal pad or wire-bonding area for the cathode terminal. This embodiment provides three impedance options after a chip containing array 600 is made. The options are available for selection when the chip is attached to a submount (not shown). Assume that there is an anode contact region on the submount. Bonding wires may be used to connect the anode contact region with any one of the three sub-arrays, i.e., connecting the anode contact region to areas 604 and 611, areas 605 and 612, or areas 609 and 613. Among the options, the first one yields the largest input impedance, while the third or last one yields the smallest input impedance.

FIG. 7 schematically illustrates a series-connected VCSEL array 700 in a top view, according to one embodiment of the present invention. Again, the exemplary VCSEL array contains three sub-arrays. The array is built on a conductive substrate. A semi-insulating layer is grown on the substrate. VCSEL structures of the array are fabricated on the semi-insulating layer. The bottom surface of the conductive substrate is coated with a bottom contact metal.

Metal layers 701 and 706 are the common anode and cathode contacts of sub-array 1. Metal layers 702 and 707 are the common anode and cathode contacts of sub-array 2. Metal layers 703 and 708 are the common anode and cathode contacts of sub-array 3. Metal layers 706 and 702 are connected by a metal structure and so are metal layers 707 and 703. The metal structure may resemble structure 410 of VCSEL array 400 (shown in FIG. 4).

The metal structure connects a common cathode contact of a sub-array to a common anode contact of a neighboring or adjacent sub-array. Thus, the sub-arrays are connected in series. Metal layer 701, the common anode contact of sub-array 1, is the anode terminal of the array, while metal layer 708, the common cathode contact of sub-array 3, is the cathode terminal of the array.

The anode terminal has wire-bonding areas 704 and 705. The cathode terminal, i.e., metal layer 708, may be electrically connected to the conductive layer through a via hole and a metal configuration. The metal configuration may resemble configuration 411 which connects metal layer 406 with metal layer 413 in the embodiment shown in FIG. 4. Since the cathode terminal is connected to the conductive layer, it is connected to the bottom contact metal too. Thus, after array 700 is mounted on a submount, the cathode terminal may be electrically connected to a metal contact region on the submount through the bottom contact metal. For instance, solder paste or solder bumps may be arranged on the metal contact region. The array or array chip may be aligned to and placed in the paste area or bump area. After a reflow process, the chip may be fixed on the submount and the bottom contact metal electrically connected to the metal contact region permanently.

Because the cathode terminal is connected to the submount directly, bonding wires are only arranged for connection between the submount and the anode terminal of array 700. Moreover, metal layer 701 may be expanded to cover a larger area, compared to the embodiments shown in FIGS. 5 and 6, since there is no need for a wire-bonding area for the cathode terminal. For instance, layer 701 may partially or totally surround the other sub-arrays, wherein the latter scenario is depicted in the figure exemplarily. When layer 701 is enlarged, more wire-bonding areas for the anode terminal may be arranged. When a larger anode pad metal, more bonding areas, and more boding wires are used, the total input impedance of the array package is reduced. It provides another option to control or adjust the overall input impedance of a VCSEL array package.

Although specific embodiments of the invention have been disclosed, those having ordinary skill in the art will understand that changes can be made to the specific embodiments without departing from the spirit and scope of the invention. The scope of the invention is not to be restricted, therefore, to the specific embodiments. Furthermore, it is intended that the appended claims cover any and all such applications, modifications, and embodiments within the scope of the present invention.

The invention claimed is:

1. A Vertical Cavity Surface Emitting Laser (VCSEL) array for generating a laser beam, comprising:
   an isolation layer, the isolation layer at least electrically semi-insulating;
   a plurality of VCSEL sub-arrays formed in an area on the isolation layer and including at least a first sub-array and a second sub-array, the first sub-array comprising a plurality of VCSEL structures connected in parallel with a common cathode contact and a common anode contact, each VCSEL structure comprising a first reflector region over the isolation layer, a current and/or optical confining structure, an active region over the first reflector region, a second reflector region over the active region, and a first metal layer over and electrically connected to the second reflector region, first metal layers of the plurality of VCSEL structures of the first sub-array being physically connected, the first and second sub-arrays separated by an isolation structure; and
   a metal structure electrically connecting the common cathode contact of the first sub-array and a common anode contact of the second sub-array, the metal structure being made of a metallic material.

2. The VCSEL array of claim 1, wherein a bandgap energy level of the isolation layer is higher than photon energy of the laser beam.

3. The VCSEL array of claim 1, wherein each VCSEL structure further comprises a conductive layer between the isolation layer and the first reflector region.

4. The VCSEL array of claim 3, wherein the first sub-array further comprises a second metal layer formed on the conductive layer.

5. The VCSEL array of claim 4, wherein the second metal layer is electrically connected to the common cathode contact of the first sub-array.

6. The VCSEL array of claim 4, wherein the second metal layer is formed in a hole that exposes the conductive layer.

7. The VCSEL array of claim 6, wherein the metal structure is formed on a wall of the hole.

8. A Vertical Cavity Surface Emitting Laser (VCSEL) array for generating a laser beam, comprising:
   an isolation layer, the isolation layer at least electrically semi-insulating, a bandgap energy level of the isolation layer higher than photon energy of the laser beam;
   a plurality of VCSEL sub-arrays formed in an area on the isolation layer and including at least a first sub-array and a second sub-array, the first sub-array comprising a plurality of VCSEL structures connected in parallel with a common cathode contact and a common anode contact, each VCSEL structure comprising a first reflector region over the isolation layer, a current and/or optical confining structure, an active region over the first reflector region, a second reflector region over the active region, and a first metal layer over and electrically connected to the second reflector region, first metal layers of the plurality of VCSEL structures of the first sub-array being physically connected, the first and second sub-arrays separated by an isolation structure; and
   a metal structure electrically connecting the common cathode contact of the first sub-array and a common anode contact of the second sub-array, the metal structure being made of a metallic material.

9. The VCSEL array of claim 8, wherein each VCSEL structure further comprises a conductive layer between the isolation layer and the first reflector region.

10. The VCSEL array of claim 9, wherein the first sub-array further comprises a second metal layer formed on the conductive layer.

11. The VCSEL array of claim 10, wherein the second metal layer is electrically connected to the common cathode contact of the first sub-array.

12. The VCSEL array of claim 10, wherein the second metal layer is formed in a hole that exposes the conductive layer.

13. The VCSEL array of claim 12, wherein the metal structure is formed on a wall of the hole.

14. A method for forming a Vertical Cavity Surface Emitting Laser (VCSEL) array, comprising:
   forming an isolation layer, the isolation layer at least electrically semi-insulating;
   forming a plurality of VCSEL sub-arrays including at least a first sub-array and a second sub-array and in an area on the isolation layer, the first sub-array comprising a plurality of VCSEL structures connected in parallel with a common cathode contact and a common anode contact, each VCSEL structure comprising a first reflector region over the isolation layer, a current and/or optical confining structure, an active region over the first reflector region, a second reflector region over the active region, and a first metal layer over and electrically connected to the second reflector region, first metal layers of the plurality of VCSEL structures of the first sub-array being physically connected, the first and second sub-arrays separated by an isolation structure; and forming a metal structure by depositing a metallic material, the metal structure electrically connecting the common cathode contact of the first sub-array and a common anode contact of the second sub-array.

15. The method of claim 14, wherein a bandgap energy level of the isolation layer is higher than photon energy of the laser beam.

16. The method of claim 14, wherein each VCSEL structure further comprises a conductive layer between the isolation layer and the first reflector region.

17. The method of claim 16, wherein the first sub-array further comprises a second metal layer deposited on the conductive layer.

18. The method of claim 17, wherein the second metal layer is electrically connected to the common cathode contact of the first sub-array.

19. The method of claim 17 further comprising forming a hole to expose the conductive layer, wherein the second metal layer is deposited in the hole.

20. The method of claim 19, wherein the metal structure is formed on a wall of the hole.

* * * * *